(12) United States Patent
Kim

(10) Patent No.: US 10,403,583 B2
(45) Date of Patent: Sep. 3, 2019

(54) FAN-OUT SEMICONDUCTOR PACKAGE

(71) Applicant: SAMSUNG ELECTRONICS CO., LTD., Suwon-si (KR)

(72) Inventor: Da Hee Kim, Suwon-si, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/938,596

(22) Filed: Mar. 28, 2018

(65) Prior Publication Data

US 2019/0051619 A1 Feb. 14, 2019

(30) Foreign Application Priority Data

Aug. 10, 2017 (KR) .................. 10-2017-0101739

(51) Int. Cl.
*H01L 23/00* (2006.01)
*H01L 23/31* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ..... H01L 23/562; H01L 24/20; H01L 21/565; H01L 21/4853; H01L 21/4857; H01L 24/19; H01L 23/3114; H01L 23/5389; H01L 23/5386; H01L 23/5383; H01L 23/3128; H01L 2924/3511; H01L 2224/214
(Continued)

(56) References Cited

U.S. PATENT DOCUMENTS

2014/0048906 A1 2/2014 Shim et al.
2015/0061093 A1 3/2015 Kim et al.
(Continued)

FOREIGN PATENT DOCUMENTS

| CN | 104425433 A | 3/2015 |
| TW | 201618196 A | 5/2016 |
| TW | 201727849 A | 8/2017 |

OTHER PUBLICATIONS

Taiwanese Office Action dated Mar. 6, 2019 issued in Taiwanese Patent Application No. 107110582 (with English translation).

*Primary Examiner* — Caleen O Sullivan

(74) *Attorney, Agent, or Firm* — Sughrue Mion, PLLC

(57) ABSTRACT

A fan-out semiconductor package includes: a semiconductor chip; a first connection member including a plurality of redistribution layers and one or more layer of vias; an encapsulant; and a second connection member, wherein the encapsulant has first openings exposing at least portions of the first connection member, the first connection member has second openings exposing at least portions of a redistribution layer disposed at an uppermost portion among the plurality of redistribution layers, at least portions of the first openings and the second openings overlap each other, and a content of a metal constituting the plurality of redistribution layers and the one or more layer of vias is higher in a lower portion of the first connection member than in an upper portion of the first connection member.

19 Claims, 18 Drawing Sheets

(51) Int. Cl.
*H01L 23/538* (2006.01)
*H01L 21/48* (2006.01)
*H01L 21/56* (2006.01)

(52) U.S. Cl.
CPC ........ *H01L 21/565* (2013.01); *H01L 23/3114* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/3511* (2013.01)

(58) Field of Classification Search
USPC .......................................................... 257/668
See application file for complete search history.

(56) References Cited

U.S. PATENT DOCUMENTS

| | | | |
|---|---|---|---|
| 2015/0348912 A1* | 12/2015 | Su | H01L 21/4842 257/666 |
| 2016/0043047 A1 | 2/2016 | Shim et al. | |
| 2016/0276307 A1 | 9/2016 | Lin | |
| 2017/0133309 A1 | 5/2017 | Kim et al. | |
| 2018/0061794 A1* | 3/2018 | Kim | H01L 23/293 |
| 2018/0096927 A1* | 4/2018 | Kim | H01L 23/49822 |
| 2018/0197832 A1* | 7/2018 | Kim | H01L 23/293 |

\* cited by examiner

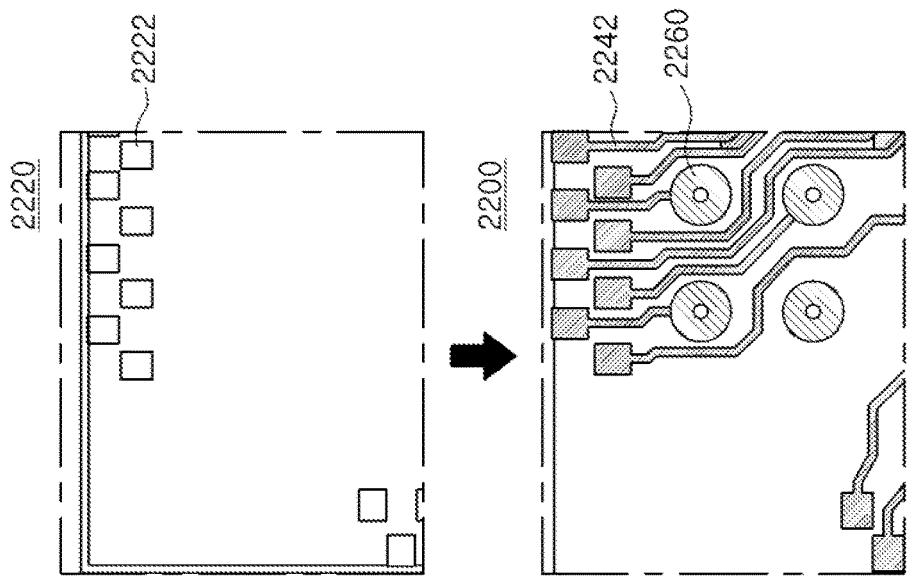
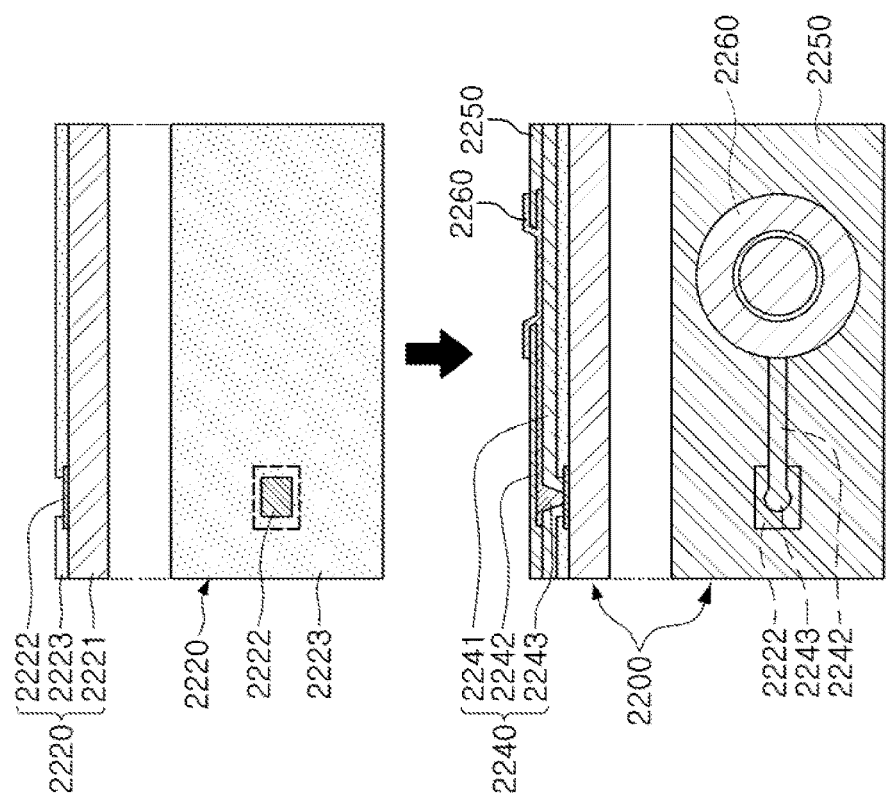
FIG. 3B
FIG. 3A

FAN-OUT SEMICONDUCTOR PACKAGE

CROSS-REFERENCE TO RELATED APPLICATION(S)

This application claims the benefit of priority to Korean Patent Application No. 10-2017-0101739, filed on Aug. 10, 2017 in the Korean Intellectual Property Office, the disclosure of which is incorporated herein by reference in its entirety.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

A significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and may allow a plurality of pins to be implemented by redistributing connection terminals outwardly of a region in which a semiconductor chip is disposed.

Furthermore, a plurality of semiconductor packages may be connected to each other using solder balls, or the like, to thus be used as a package-on-package, or connected to a circuit board such as an interposer, or the like. In these configurations, elements are mounted to be stacked on a semiconductor package and then connected to the semiconductor package using solder balls, or the like, to promote improvement of functions.

SUMMARY

An aspect of the present disclosure may provide a fan-out semiconductor package in which a cost may be reduced, a thickness may be reduced due to a reduction in a joint gap, and a warpage control effect may be achieved.

According to an aspect of the present disclosure, a fan-out semiconductor package may be provided, in which a connection member including a plurality of redistribution layers and one or more vias is introduced as a core of the package, openings penetrating through the connection member are formed in an upper portion of the connection member, and the plurality of redistribution layers and the one or more vias of the connection member are formed in lower portions of the openings to be asymmetrical in relation to the connection member.

According to an aspect of the present disclosure, a fan-out semiconductor package may include: a semiconductor chip having an active surface having connection pads disposed thereon and an inactive surface opposing the active surface; a first connection member having a through-hole in which the semiconductor chip is disposed and including a plurality of redistribution layers electrically connected to the connection pads and one or more layer of vias electrically connecting the plurality of redistribution layers to each other; an encapsulant covering the first connection member and encapsulating at least portions of side surfaces and the inactive surface of the semiconductor chip; a second connection member disposed on the first connection member and the active surface of the semiconductor chip and including a redistribution layer electrically connected to the connection pads, wherein the encapsulant has first openings exposing at least portions of the first connection member, the first connection member has second openings exposing at least portions of a redistribution layer disposed at an uppermost portion among the plurality of redistribution layers, at least portions of the first openings and the second openings overlap each other, and a content of a metal constituting the plurality of redistribution layers and the one or more layer of vias is higher in a lower portion of the first connection member than in an upper portion of the first connection member.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
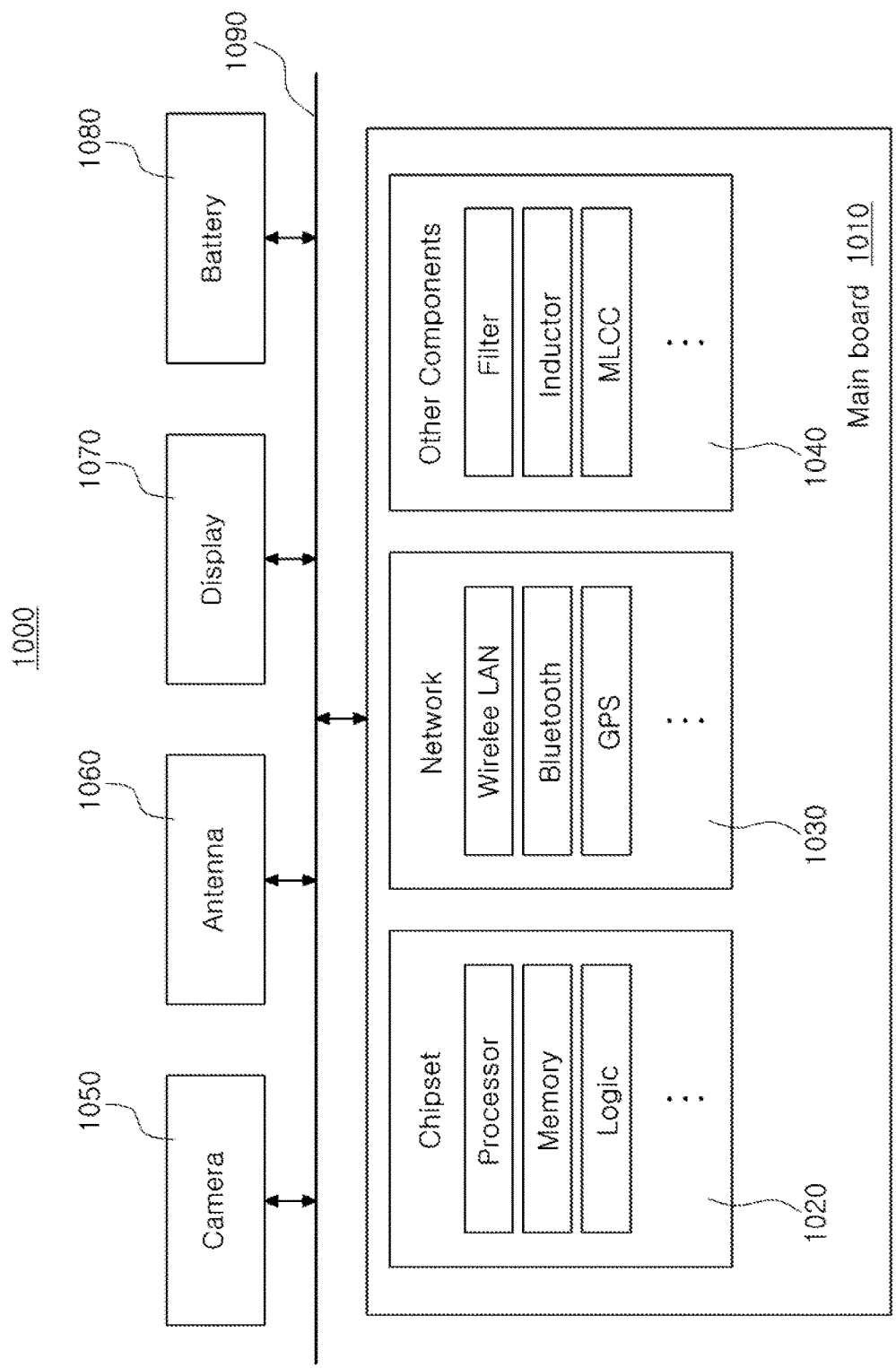
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
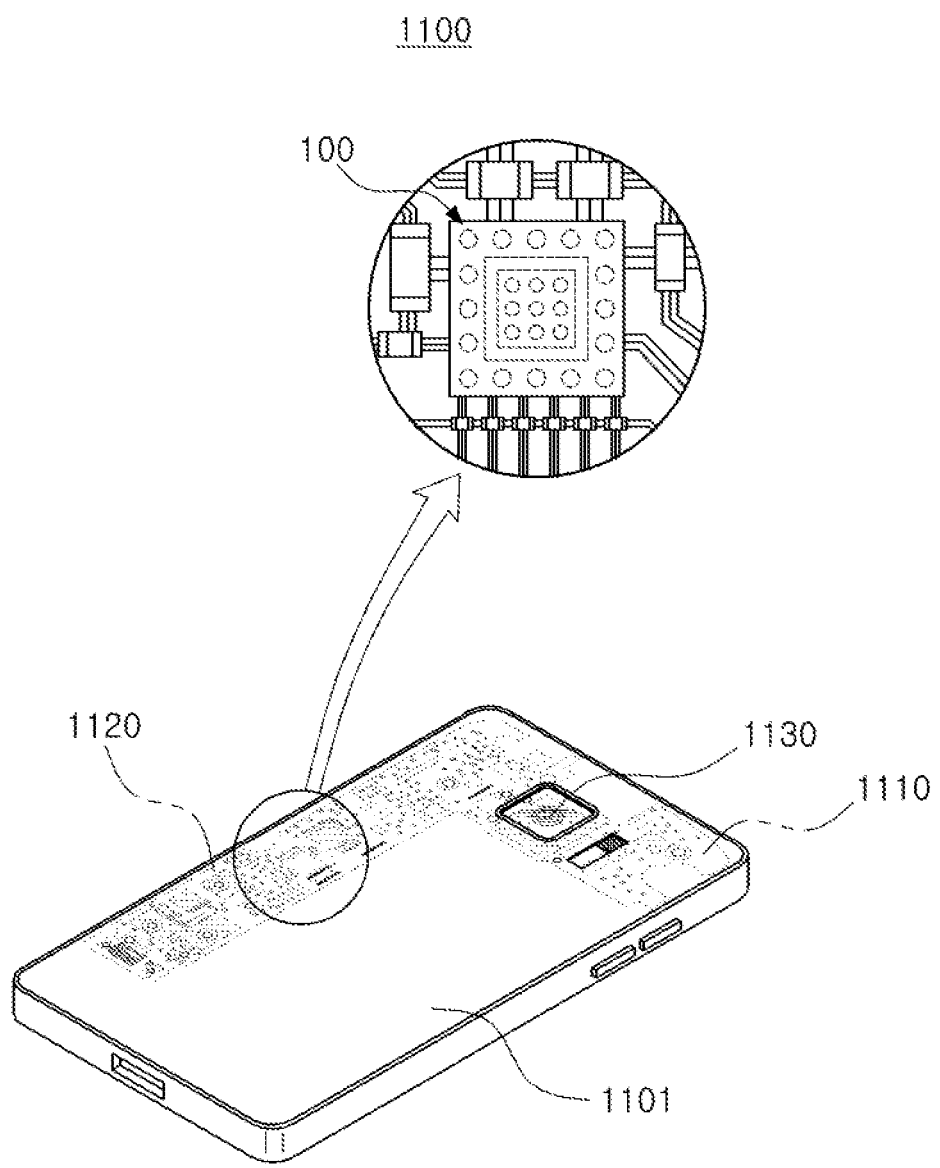
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
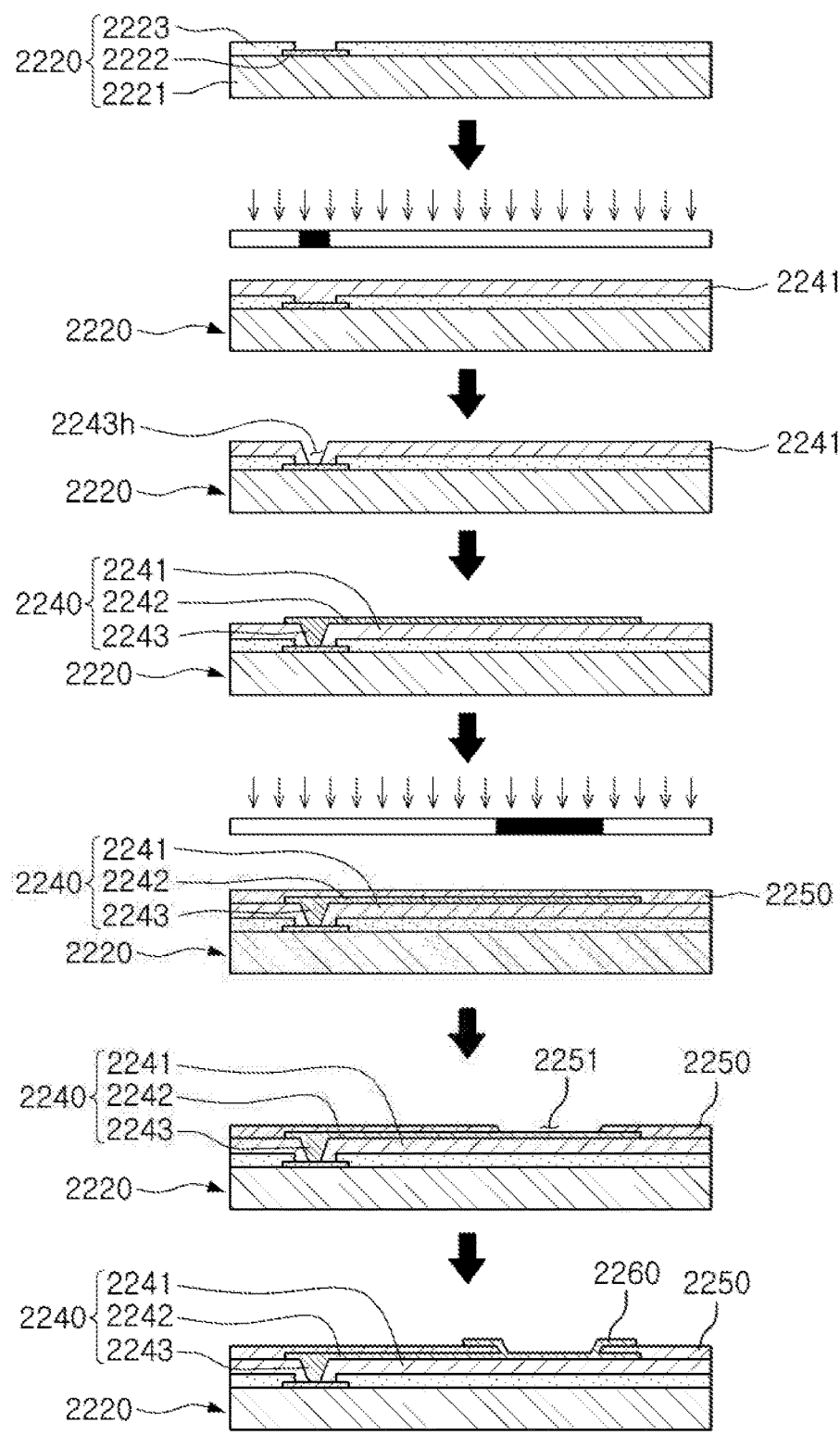
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming a redistribution layer 2242 and vias 2243. Then, a passivation layer 2250 protecting the connection member 2240 may be formed, an opening 2251 may be formed, and an under-bump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
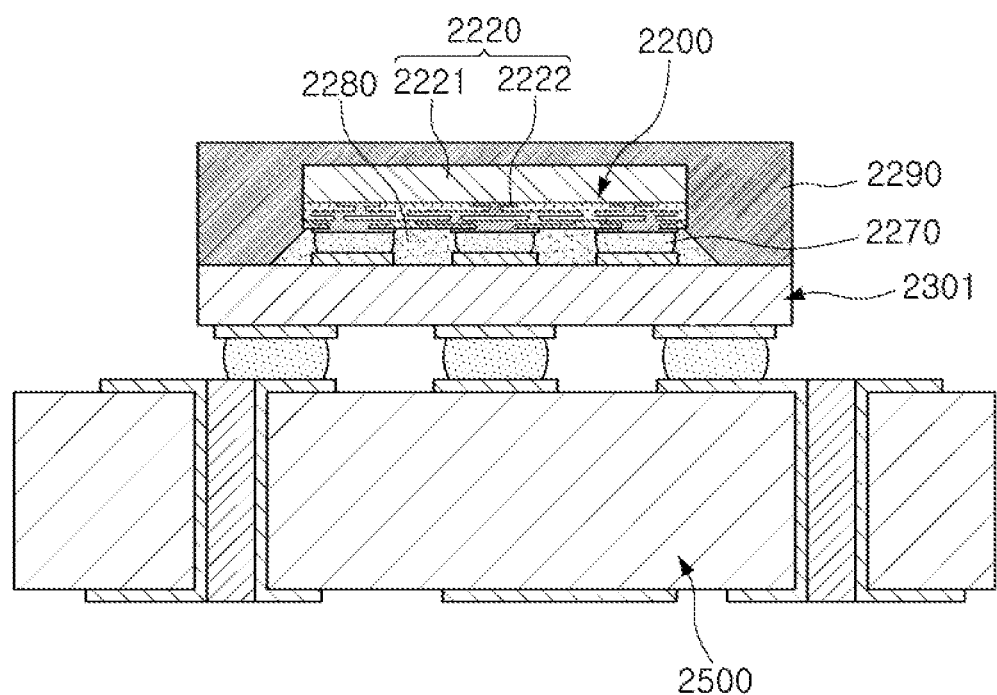
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
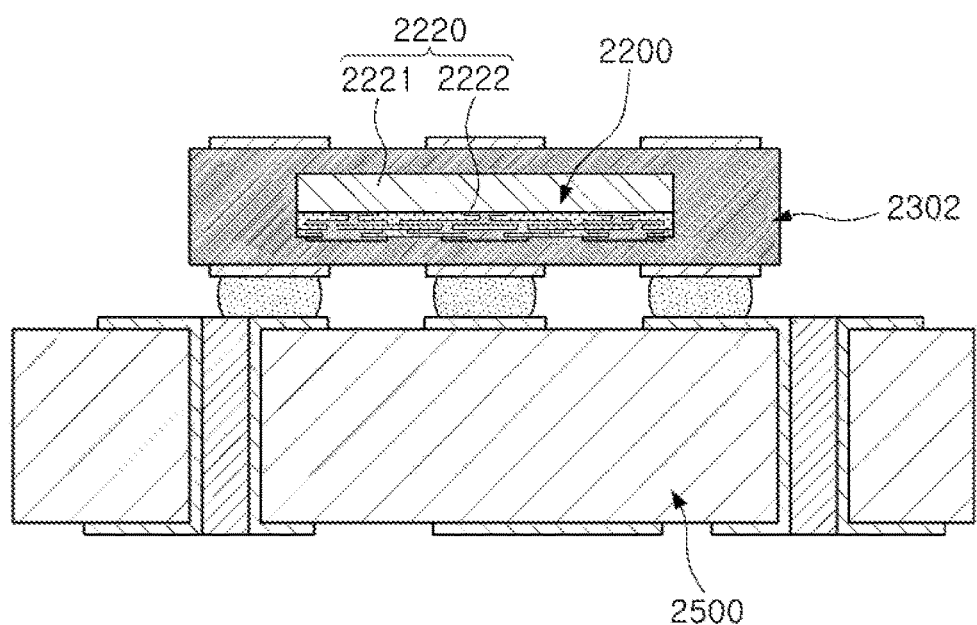
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
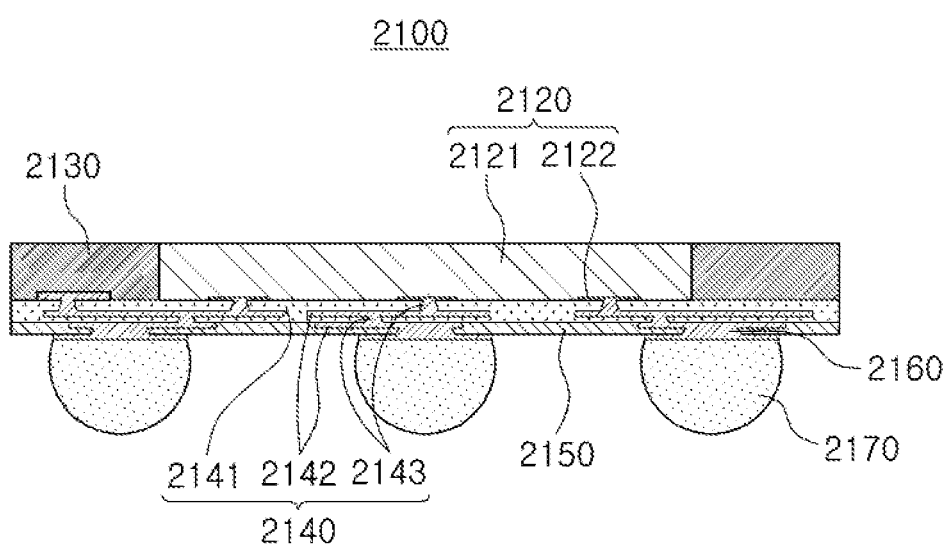
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
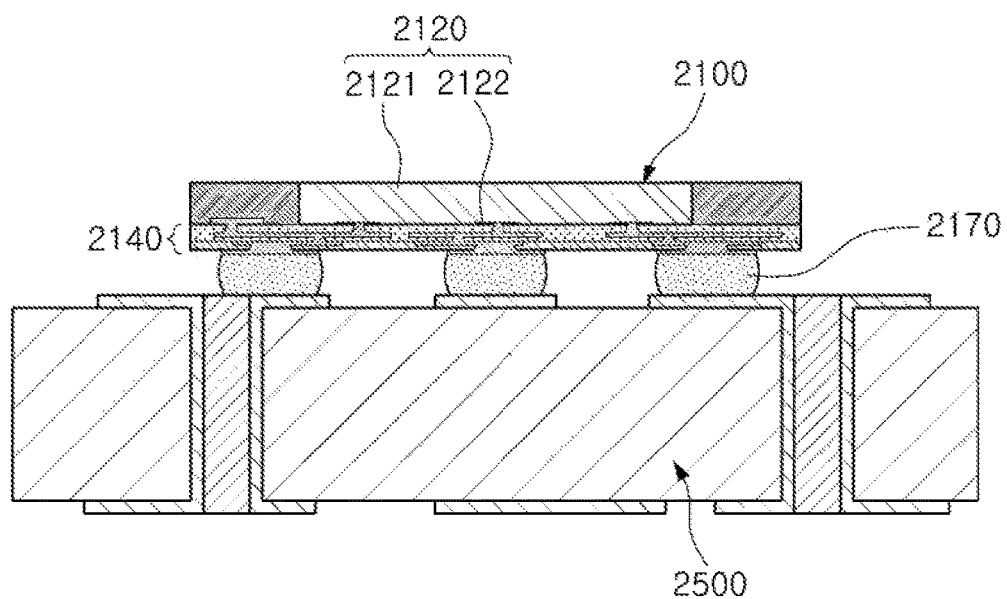
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package in which a cost may be reduced, a thickness may be reduced due to a reduction in a joint gap, and a warpage control effect may be achieved will hereinafter be described with reference to the drawings.

Figure 9:
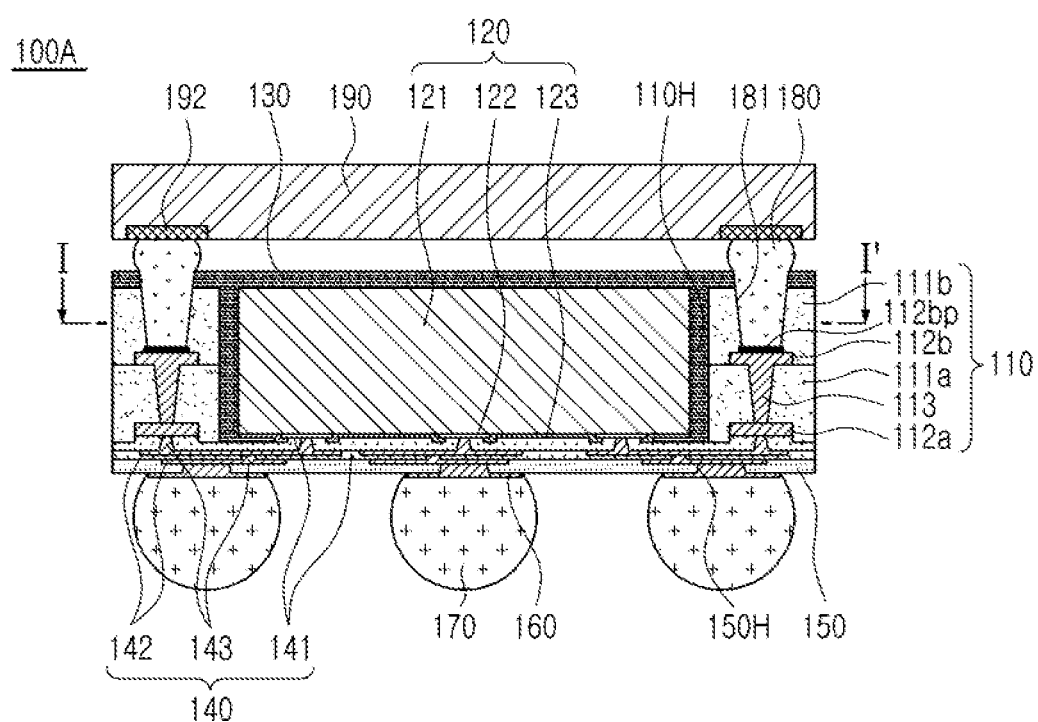
FIG. 9 is a schematic cross-sectional view illustrating an example of a fan-out semiconductor package.

FIG. 9 is a schematic cross-sectional view illustrating an example of a fan-out semiconductor package.

Figure 10:
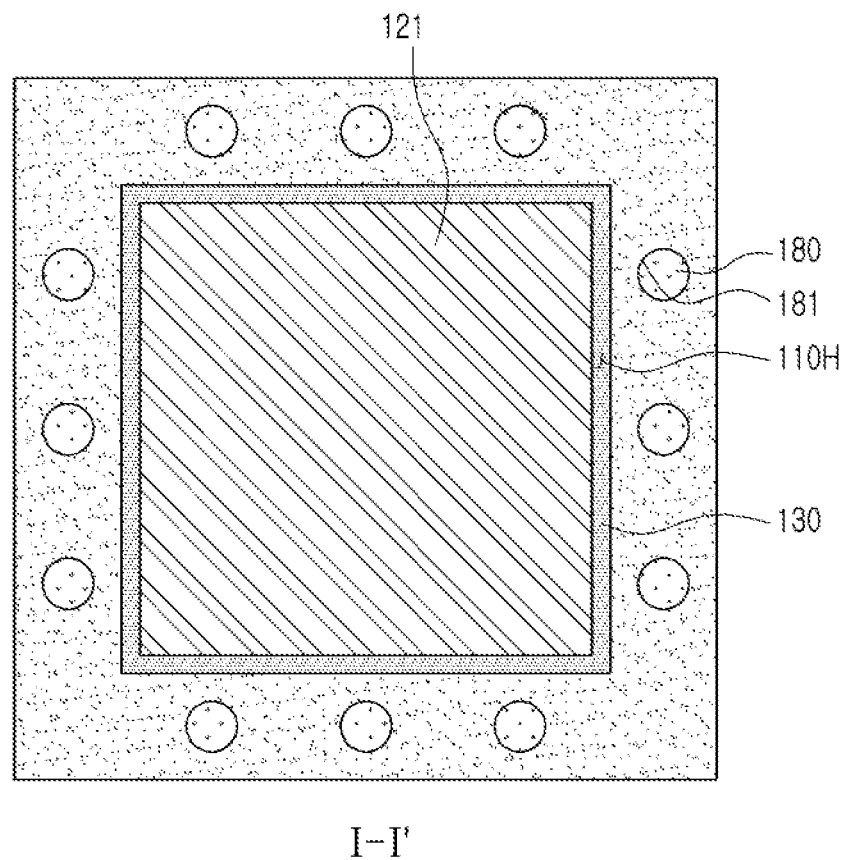
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, an encapsulant 130 covering the first connection member 110 and encapsulating at least portions of side surfaces and the inactive surface of the semiconductor chip 120, a second connection member 140 disposed on the first connection member 110 and the active surface of the semiconductor chip 120 and including redistribution layers 142 electrically connected to the connection pads 122, a passivation layer 150 disposed on the second connection member 140, an underbump metal layer 160 disposed in openings 150H of the passivation layer 150, electrical connection structures 170 disposed on the underbump metal layer 160, openings 181 penetrating through a region of the encapsulant 130 covering the first connection member 110 and a portion of the first connection member 110, electrical connection structures 180 filling the openings 181 and protruding from the encapsulant 130, and a circuit board 190 disposed above the encapsulant 130 to be spaced apart from the encapsulant 130 by a predetermined distance and connected to the electrical connection structures 180. The openings 181 may include first openings formed in the encapsulant 130 to expose at least portions of the first connection member 110 and second openings formed in the first connection member 110 to expose at least portions of a redistribution layer 112b disposed at an uppermost portion among a plurality of redistribution layers 112a and 112b of the first connection member 110, and at least portions of the first openings and the second openings may overlap each other. That is, a lower portion of the first opening and an upper portion of the second opening may be aligned and integrated with each other to become the opening 181.

The first connection member 110 may include the plurality of redistribution layers 112a and 112b electrically connected to the connection pads 122 and vias 113 electrically connecting the plurality of redistribution layers 112a and 112b to each other. In this case, a content of a metal constituting the plurality of redistribution layers 112a and 112b and the vias 113 may be higher in a lower portion of the first connection member 110 than in an upper portion of the first connection member 110. Here, a redistribution layer and vias are not formed in the upper portion of the first connection member 110 since the openings 181 and the electrical connection structures 180 are disposed in the upper portion of the first connection member 110. In this case, since an amount of a metal of the first connection member 110 serving as a core may be reduced, a cost may be reduced, and since the openings 181 are deeply formed to penetrate through the first connection member 110, even in a case in which the first connection member 110 is connected to the circuit board 190, or the like, through the electrical connection structures 180, a joint gap may be reduced, resulting in a reduction in an entire thickness of the fan-out semiconductor package 100A. In addition, a metal density of the first connection member 110 may be lowered in an asymmetrical form, and may be concentrated particularly on the lower portion of the first connection member 110, such that warpage of the fan-out semiconductor package 100A may be reduced by a control of a coefficient of thermal expansion (CTE) through the first connection member 110.

The respective components included in the fan-out semiconductor package 100A according to the exemplary embodiment will hereinafter be described in more detail.

The first connection member 110 may improve rigidity of the fan-out semiconductor package 100A depending on certain materials, and serve to secure uniformity of a thickness of the encapsulant 130. That is, the first connection member 110 may be used as a support member. In addition, the first connection member 110 may allow the fan-out semiconductor package 100A to have a POP type or a form in which a separate circuit board is stacked on the fan-out semiconductor package 100A through connection between upper and lower portions. The first connection member 110 may have the through-hole 110H. The semiconductor chip 120 may be disposed in the through-hole 110H to be spaced apart from the first connection member 110 by a predetermined distance. The side surfaces of the semiconductor chip 120 may be surrounded by the first connection member 110. However, such a form is only an example and may be variously modified to have other forms, and the first connection member 110 may perform another function depending on such a form.

The first connection member 110 may include a first insulating layer 111a in contact with the second connection member 140, a first redistribution layer 112a in contact with the second connection member 140 and embedded in a first surface of the first insulating layer 111a, a second redistribution layer 112b disposed on a second surface of the first insulating layer 111a opposing the first surface of the first insulating layer 111a, the vias 113 penetrating through the first insulating layer 111a and connecting the first and second redistribution layers 112a and 112b to each other, and a second insulating layer 111b disposed on the first insulating layer 111a and covering at least portions of the second redistribution layer 112b. The openings 181, particularly, the second openings may penetrate through the first insulating layer 111a, and may be filled with the electrical connection structures 180. The second redistribution layer 112b may be connected to the electrical connection structures 180. Here, a surface treatment layer 112bp may be formed on an upper surface of the second redistribution layer 112b connected to the electrical connection structures 180.

When the first redistribution layer 112a is embedded in the first insulating layer 111a, a step generated due to a thickness of the first redistribution layer 112a may be significantly reduced, and an insulating distance of the second connection member 140 may thus become constant. That is, a difference between a distance from the redistribution layer 142 of the second connection member 140 to a lower surface of the first insulating layer 111a and a distance from the redistribution layer 142 of the second connection member 140 to the connection pad 122 of the semiconductor chip 120 may be smaller than a thickness of the first redistribution layer 112a. Therefore, a high density wiring design of the second connection member 140 may be easy.

A lower surface of the first redistribution layer 112a of the first connection member 110 may be disposed on a level above a lower surface of the connection pad 122 of a semiconductor chip 120. In addition, a distance between the redistribution layer 142 of the second connection member 140 and the first redistribution layer 112a of the first connection member 110 may be greater than that between the redistribution layer 142 of the second connection member 140 and the connection pad 122 of the semiconductor chip 120. Here, the first redistribution layer 112a may be recessed into the first insulating layer 111a. As described above, when the first redistribution layer 112a is recessed into the first insulating layer 111a, such that the lower surface of the first insulating layer 111a and the lower surface of the first redistribution layer 112a have a step therebetween, a phenomenon in which a material of the encapsulant 130 bleeds to pollute the first redistribution layer 112a may be prevented. The second redistribution layer 112b of the first connection member 110 may be disposed on a level between the active surface and the inactive surface of the semiconductor chip 120. The first connection member 110 may be formed at a thickness corresponding to that of the semiconductor chip 120. Therefore, the second redistribution layer 112b formed in the first connection member 110 may be disposed on the level between the active surface and the inactive surface of the semiconductor chip 120.

Thicknesses of the redistribution layers 112a and 112b of the first connection member 110 may be greater than those of the redistribution layers 142 of the second connection member 140. Since the first connection member 110 may have a thickness equal to or greater than that of the semiconductor chip 120, the redistribution layers 112a and 112b may be formed at large sizes depending on a scale of the first connection member 110. On the other hand, the redistribution layers 142 of the second connection member 140 may be formed at sizes relatively smaller than those of the redistribution layers 112a and 112b for thinness.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto build-up film (ABF), FR-4, Bismaleimide Triazine (BT), or the like. Alternatively, a PID resin may also be used as the insulating material.

The redistribution layers 112a and 112b may serve to redistribute the connection pads 122 of the semiconductor chip 120. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof, that is, a metal. The redistribution layers 112a and 112b may perform various functions depending on designs of their corresponding layers. For example, the redistribution layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a and 112b may include via pads, wire pads, connection terminal pads, and the like. Meanwhile, the surface treatment layer 112bp formed on the surface of the second redistribution layer 112b may be formed by electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113 may electrically connect the redistribution layers 112a and 112b formed on different layers to each other, resulting in an electrical path in the first connection member 110. A material of each of the vias 113 may be a conductive material such as copper (Cu), aluminum (Al), silver (Ag), tin (Sn), gold (Au), nickel (Ni), lead (Pb), titanium (Ti), or alloys thereof, that is, a metal. Each of the vias 113 may be completely filled with the conductive material, or the conductive material may be formed along a wall of each of via holes. In addition, each of the vias 113 may have all of the shapes known in the related art, such as a tapered shape, a cylindrical shape, and the like. When holes for the vias 113 are formed, some of the pads of the first redistribution layer 112a may serve as a stopper, and it may thus be advantageous in a process that each of the vias 113 has the tapered shape of which a width of an upper surface is greater than that of a lower surface. In this case, the vias 113 may be integrated with the pad patterns of the second redistribution layer 112b.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may be further formed on the active surface of the semiconductor chip 120, and bumps (not illustrated), or the like, may be connected to the connection pads 122.

The encapsulant 130 may protect the first connection member 110, the semiconductor chip 120, and the like. An encapsulation form of the encapsulant 130 is not particularly limited, but may be a form in which the encapsulant 130 surrounds at least portions of the first connection member 110, the semiconductor chip 120, and the like. For example, the encapsulant 130 may cover the first connection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The second connection member 140 may be configured to redistribute the connection pads 122 of the semiconductor chip 120. Several tens to several hundreds of connection pads 122 having various functions may be redistributed by the second connection member 140, and may be physically or electrically connected to an external source through electrical connection structures 170 to be described below depending on the functions. The second connection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second connection member 140 may include a plurality of redistribution layers 142, but is not limited thereto. That is, the second connection member 140 may also include a single layer. In addition, the second connection member 140 may also include different numbers of layers.

A material of each of the insulating layers 141 may be an insulating material. In this case, a photosensitive insulating material such as a PID resin may also be used as the insulating material. In this case, the insulating layers 141 may be formed to have a smaller thickness, and a fine pitch of the vias 143 may be achieved more easily. The materials of the insulating layers 141 may be the same as each other or may be different from each other. The insulating layers 141 may be integrated with each other depending on processes, so that a boundary therebetween may not be readily apparent.

The redistribution layers 142 may serve to substantially redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 112a and 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

The passivation layer 150 may be additionally configured to protect the second connection member 140 from external physical or chemical damage. The passivation layer 150 may have the openings 150H exposing at least portions of some of the redistribution layers 142 of the second connection member 140. The openings 150H may expose the entirety or only a portion of a surface of the redistribution layer 142. A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF including an inorganic filler and an epoxy resin may be used as the material of the passivation layer 150.

The underbump metal layer 160 may be additionally configured to improve connection reliability of the electrical connection structures 170 to improve board level reliability of the fan-out semiconductor package 100A. The underbump metal layer 160 may be disposed on walls in the openings 150H of the passivation layer 150 and the exposed redistribution layer 142 of the second connection member 140. The underbump metal layer 160 may be formed by the known metallization method using the known conductive material such as a metal.

The electrical connection structures 170 may be additionally configured to physically or electrically externally connect the fan-out semiconductor package 100A. For example, the fan-out semiconductor package 100A may be mounted on the main board of the electronic device through the electrical connection structures 170. Each of the electrical connection structures 170 may be formed of a conductive material, for example, a solder, or the like. However, this is only an example, and a material of each of the electrical connection structures 170 is not particularly limited thereto.

Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122 of the semiconductor chip 120, but are not limited thereto, or may be provided in an amount of several tens to several thousands or more or several tens to several thousands or less.

At least one of the electrical connection structures 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

The openings 181 may penetrate through the region of the encapsulant 130 covering the first connection member 110 and a portion of the first connection member 110, that is, the second insulating layer 111b. The openings 181 may be filled with the electrical connection structures 180, and each of the electrical connection structures 180 may be a land, a ball, a pin, or the like. In addition, each of the electrical connection structures 180 may be formed of a conductive material, for example, a solder, or the like. However, this is only an example, and a material of each of the electrical connection structures 180 is not particularly limited thereto.

The circuit board 190 may be the known printed circuit board (PCB). For example, the circuit board 190 may be an interposer substrate on which components are mounted, but is not limited thereto. Circuit patterns may be formed in the circuit board 190. The circuit board 190 may have electrode pads 192, which may be connected to the electrical connection structures 180. Resultantly, the circuit board 190 may also be electrically connected to the connection pads 122 of the semiconductor chip 120.

A plurality of semiconductor chips (not illustrated) may be disposed in the through-hole 110H of the first connection member 110, and the number of through-holes 110H of the first connection member 110 may be plural (not illustrated) and semiconductor chips (not illustrated) may be disposed in the through-holes, respectively. In addition, separate passive components (not illustrated) such as a condenser, an inductor, and the like, may be encapsulated together with the semiconductor chip in the through-hole 110H. In addition, a surface mounted technology component (not illustrated) may be mounted on the passivation layer 150.

Figure 11A:
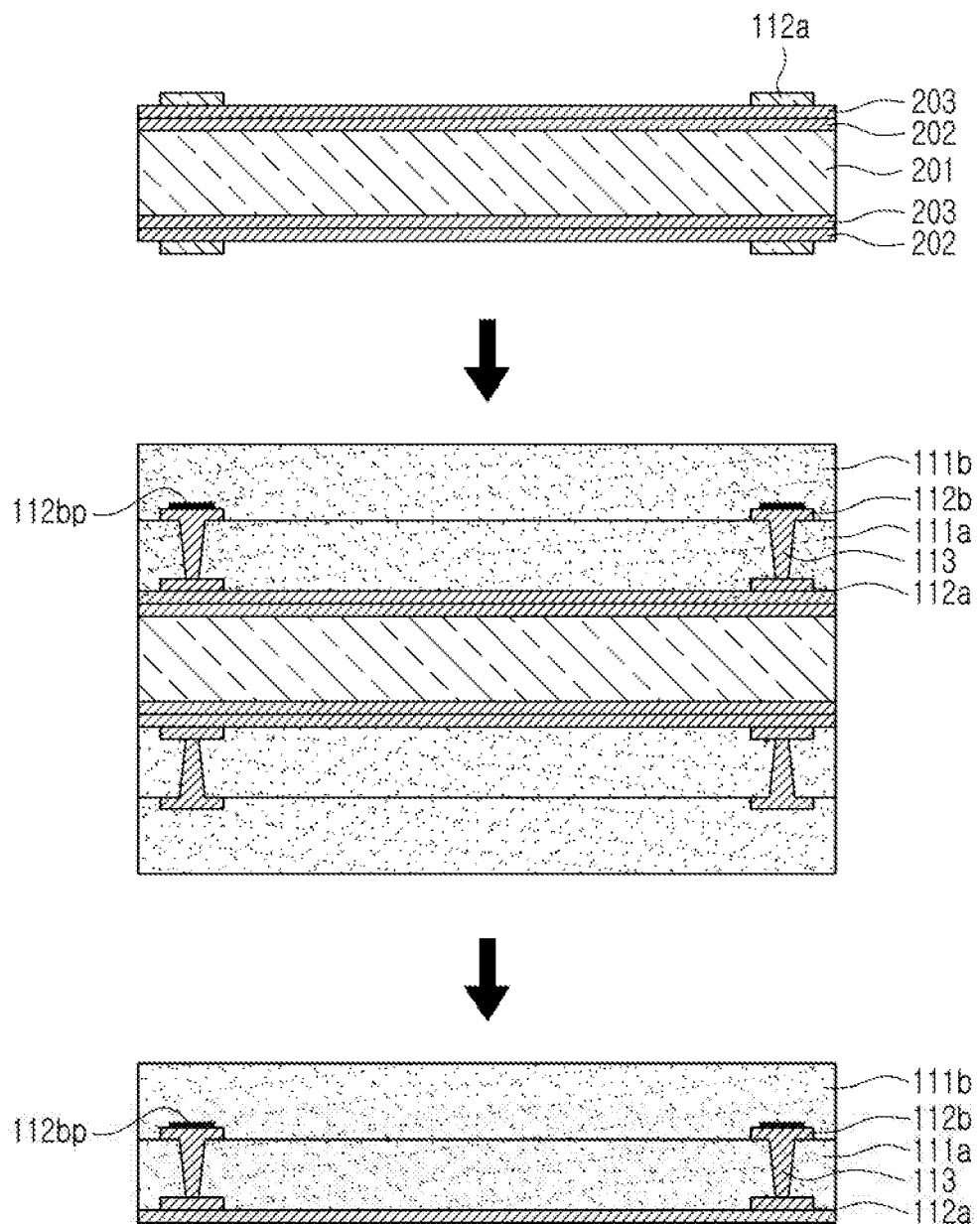
FIGS. 11A through 11C are schematic views illustrating an example of processes of manufacturing the fan-out semiconductor package of FIG. 9.
Figure 11B:
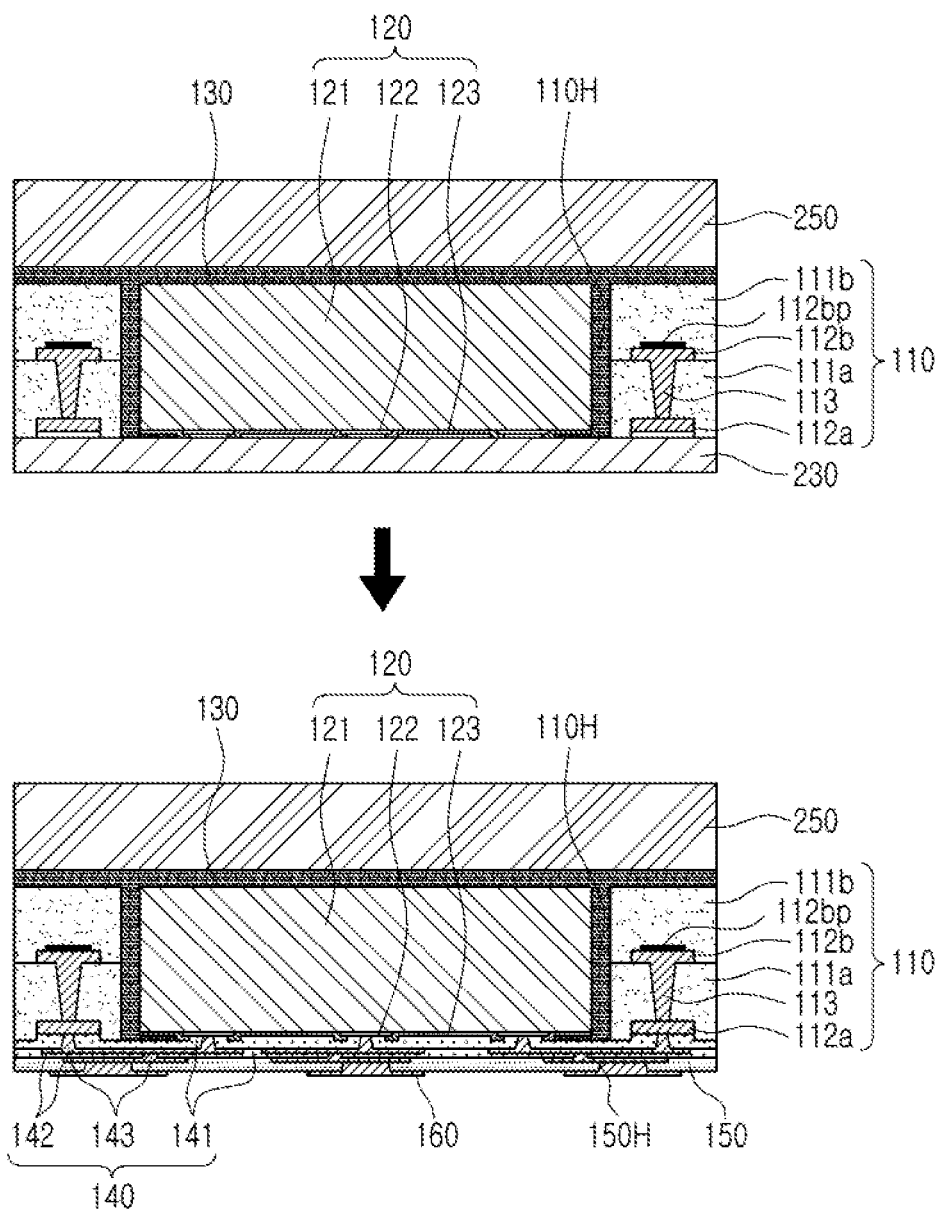
Figure 11C:
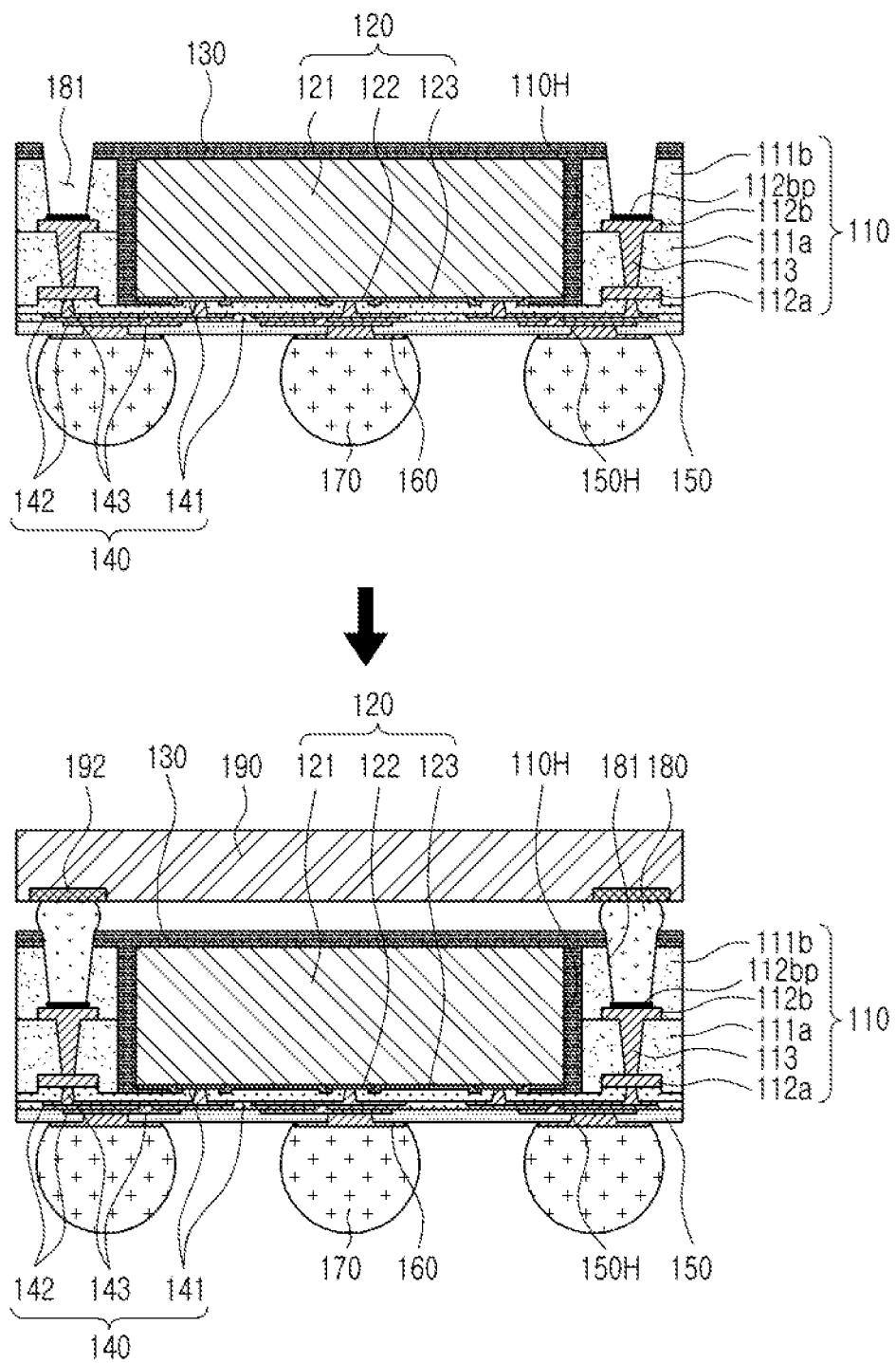

FIGS. 11A through 11C are schematic views illustrating an example of processes of manufacturing the fan-out semiconductor package of FIG. 9.

Referring to FIG. 11A, a carrier film in which a plurality of metal layers 202 and 203 are formed on upper and lower surfaces of a substrate 201 may be first prepared. The substrate 201 may be formed of various materials, for example, prepreg, ceramic, or the like, but is not limited thereto. Each of the metal layers 202 and 203 may include copper (Cu), but is not limited thereto. Then, the first redistribution layer 112a may be formed using the metal layer 203 as a seed layer, by a plating process using resist patterns. Then, the first insulating layer 111a covering the first redistribution layer 112a may be formed on the metal layer 203, via holes may be drilled, and the second redistribution layer 112b and the vias 113 may be formed by a plating process using resist patterns. In addition, the surface treatment layer 112bp may be formed on the surface of the second redistribution layer 112b. Then, the second insulating layer 111b covering the second redistribution layer 112b may be formed on the first insulating layer 111a. After the second insulating layer 111b is formed, a preliminary first connection member 110 may be separated from the carrier film by a method of separating the metal layers 202 and 203 from each other.

Then, referring to FIG. 11B, the first connection member 110 obtained by removing the metal layer 203 and forming the through-hole 110H may be attached to a tape 230. In a process of removing the metal layer 203, a lower surface of the first redistribution layer 112a may have a step with respect to a lower surface of the first insulating layer 111a. Then, the semiconductor chip 120 may be attached to the tape 230 in the through-hole 110H, and may be encapsulated with the encapsulant 130. Then, a detachable film 250 may be attached to the encapsulant 130. The detachable film 250 may be a substrate formed of various materials, such as a copper clad laminate (CCL), a ceramic substrate, a glass substrate, or the like. Then, the tape 230 may be removed, and the second connection member 140, the passivation layer 150, and the underbump metal layer 160 may be sequentially formed in a region in which the tape 230 is removed. The second connection member 140 may be formed by forming the insulating layers 141 using a PID, or the like, and drilling via holes by a photolithography method, and then performing patterning by a plating process to form the redistribution layers 142 and the vias 143. The passivation layer 150 may be formed by the known lamination method or applying and hardening method. The underbump metal layer 160 may be formed by the known metallization process.

Then, referring to FIG. 11C, the detachable film 250 may be removed, and the openings 181 penetrating through the encapsulant 130 and a portion of the first connection member 110 may be formed. The openings 181 may be formed using laser drilling, mechanical drilling, or the like. In addition, the electrical connection structures 170 may be formed. The electrical connection structures 170 may also be formed by performing a reflow process, or the like, on solders, or the like. Then, the electrical connection structures 180 may be formed in the openings 181 using solders, or the like, and the circuit board 190 may be connected to the electrical connection structures 180. The fan-out semiconductor package 100A according to the exemplary embodiment described above may be manufactured through a series of processes.

Figure 12:
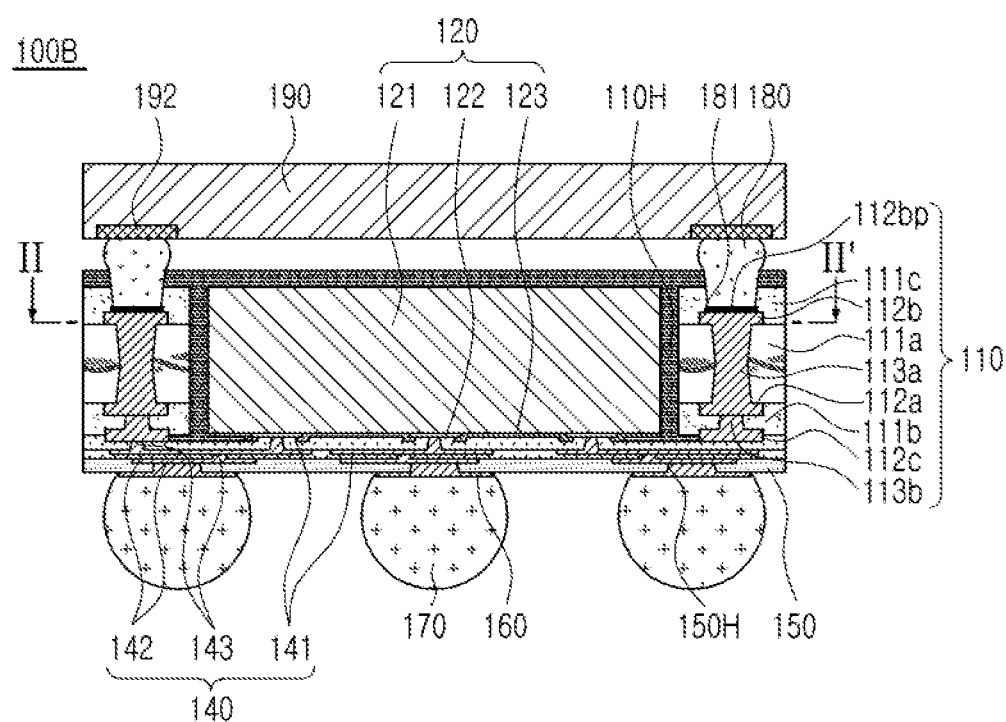
FIG. 12 is a schematic cross-sectional view illustrating another example of a fan-out semiconductor package.

FIG. 12 is a schematic cross-sectional view illustrating another example of a fan-out semiconductor package.

Figure 13:
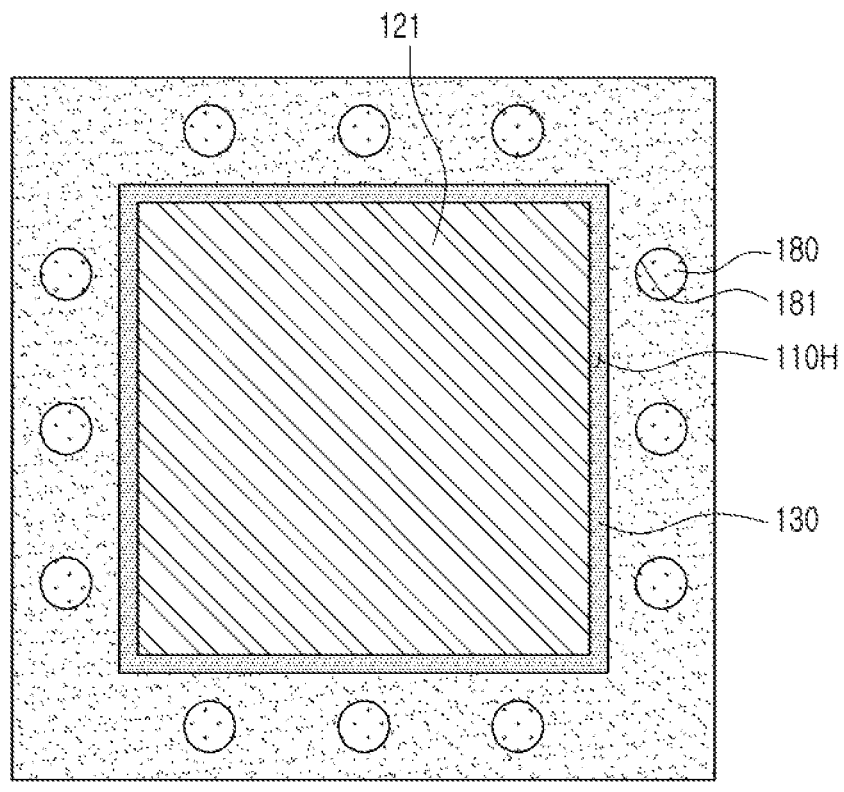
FIG. 13 is a schematic plan view taken along line II-II' of the fan-out semiconductor package of FIG. 12.

FIG. 13 is a schematic plan view taken along line II-II' of the fan-out semiconductor package of FIG. 12.

Referring to the drawings, in a fan-out semiconductor package 100B according to another exemplary embodiment in the present disclosure, a first connection member 110 may include a first insulating layer 111a, a first redistribution layer 112a disposed on a lower surface of the first insulating layer 111a, a second redistribution layer 112b disposed on an upper surface of the first insulating layer 111a, first vias 113a penetrating through the first insulating layer 111a and connecting the first and second redistribution layers 112a and 112b to each other, a second insulating layer 111b disposed on the lower surface of the first insulating layer 111a and covering at least portions of the first redistribution layer 112b, a third redistribution layer 112c disposed on a lower surface of the second insulating layer 111b and in contact with a second connection member 140, second vias 113b penetrating through the second insulating layer 111b and connecting the first and third redistribution layers 112a and 112c to each other, and a third insulating layer 111c disposed on the upper surface of the first insulating layer 111a and covering at least portions of the second redistribution layer 112b. The first to third redistribution layers 112a, 112b, and 112c may be electrically connected to connection pads 122 of a semiconductor chip 120. First openings of openings 181 may penetrate through an encapsulant 130, and second openings of the openings 181 may penetrate through the third insulating layer 111c of the first connection member 110. Electrical connection structures 180 may be formed in the openings 181, and may be connected to the second redistribution layer 112b. A surface treatment layer 112bp may be formed on a surface of the second redistribution layer 112b in contact with the electrical connection structures 180.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than that of the second vias 113b penetrating through the second insulating layer 111b.

A lower surface of the third redistribution layer 112c of the first connection member 110 may be disposed on a level below a lower surface of the connection pad 122 of the semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pad 122 of the semiconductor chip 120. Here, the third redistribution layer 112c may be disposed in a protruding form on the second insulating layer 111b, resulting in being in contact with the second connection member 140. The first redistribution layer 112a and the second redistribution layer 112b of the first connection member 110 may be disposed on a level between an active surface and an inactive surface of the semiconductor chip 120. The first connection member 110 may be formed at a thickness corresponding to that of the semiconductor chip 120. Therefore, the first redistribution layer 112a and the second redistribution layer 112b formed in the first connection member 110 may be disposed on the level between the active surface and the inactive surface of the semiconductor chip 120.

Thicknesses of the redistribution layers 112a, 112b, and 112c of the first connection member 110 may be greater than those of redistribution layers 142 of the second connection member 140. Since the first connection member 110 may have a thickness equal to or greater than that of the semiconductor chip 120, the redistribution layers 112a, 112b, and 112c may also be formed at large sizes. On the other hand, the redistribution layers 142 of the second connection member 140 may be formed at a relatively small size for thinness.

A description, or the like, of other configurations except for the abovementioned configuration overlaps that described above, and is thus omitted.

Figure 14A:
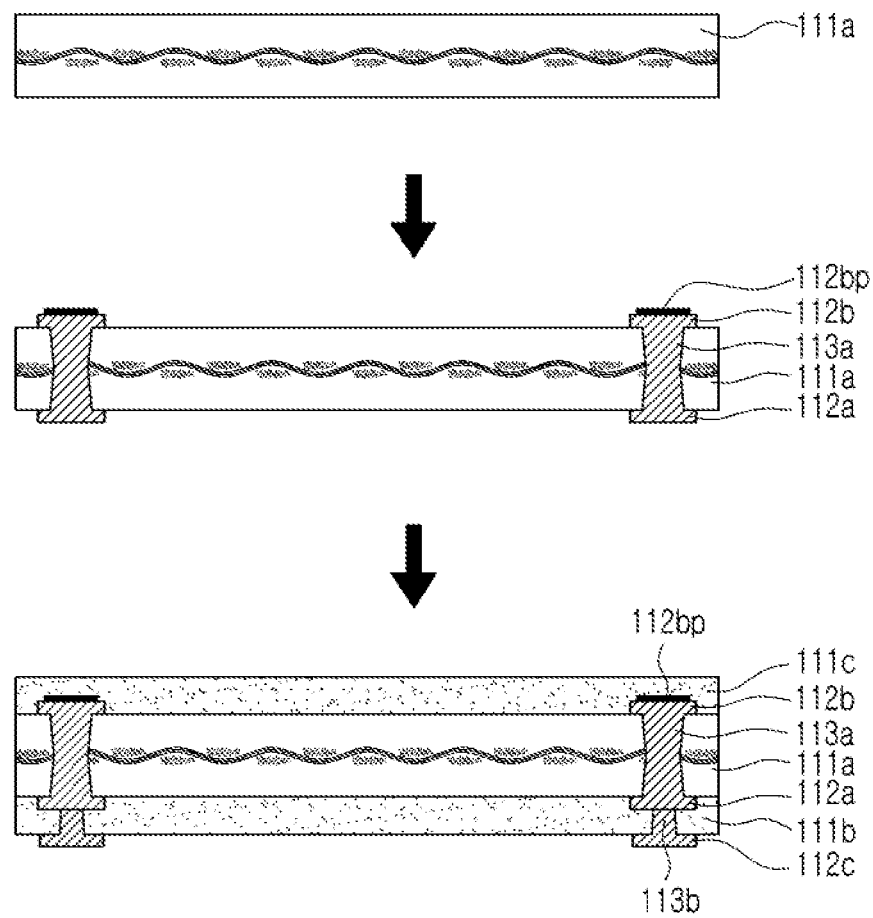
FIGS. 14A through 14C are schematic views illustrating an example of processes of manufacturing the fan-out semiconductor package of FIG. 12.
Figure 14B:
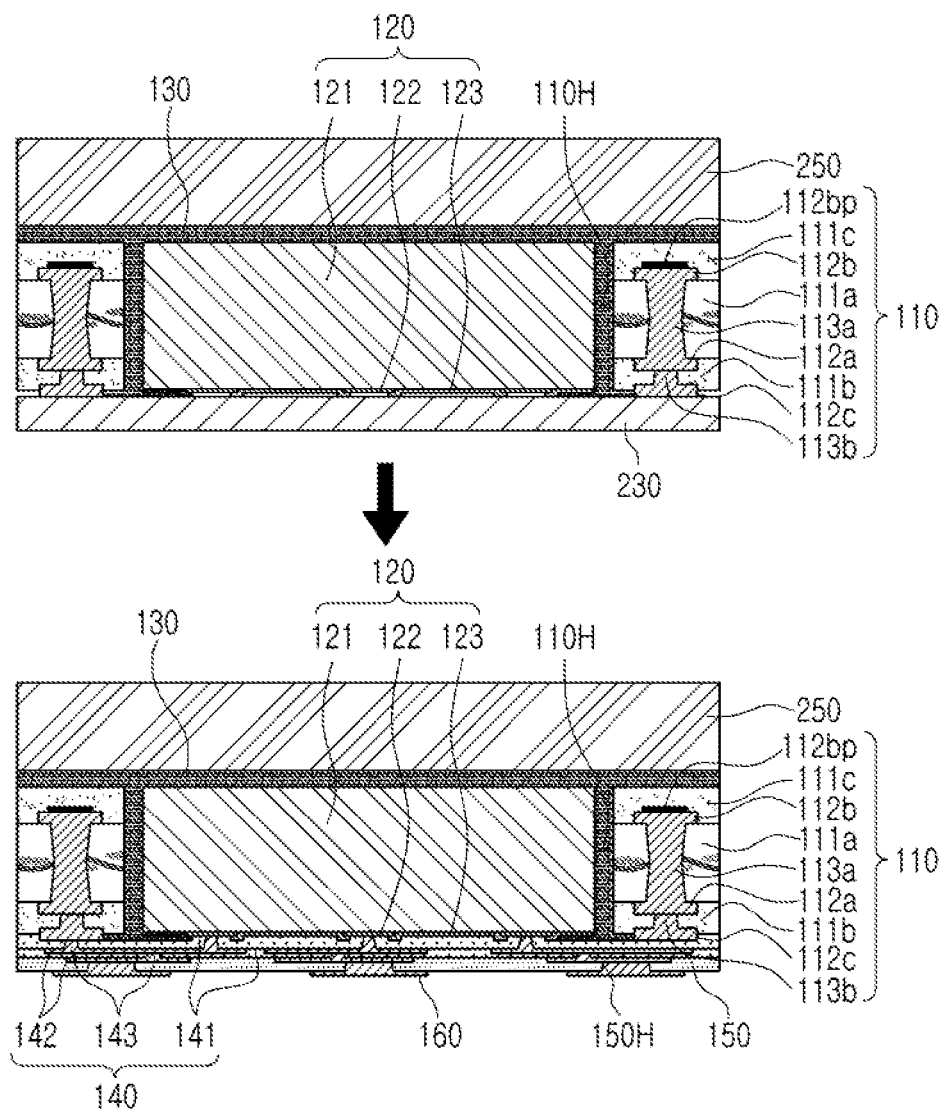
Figure 14C:
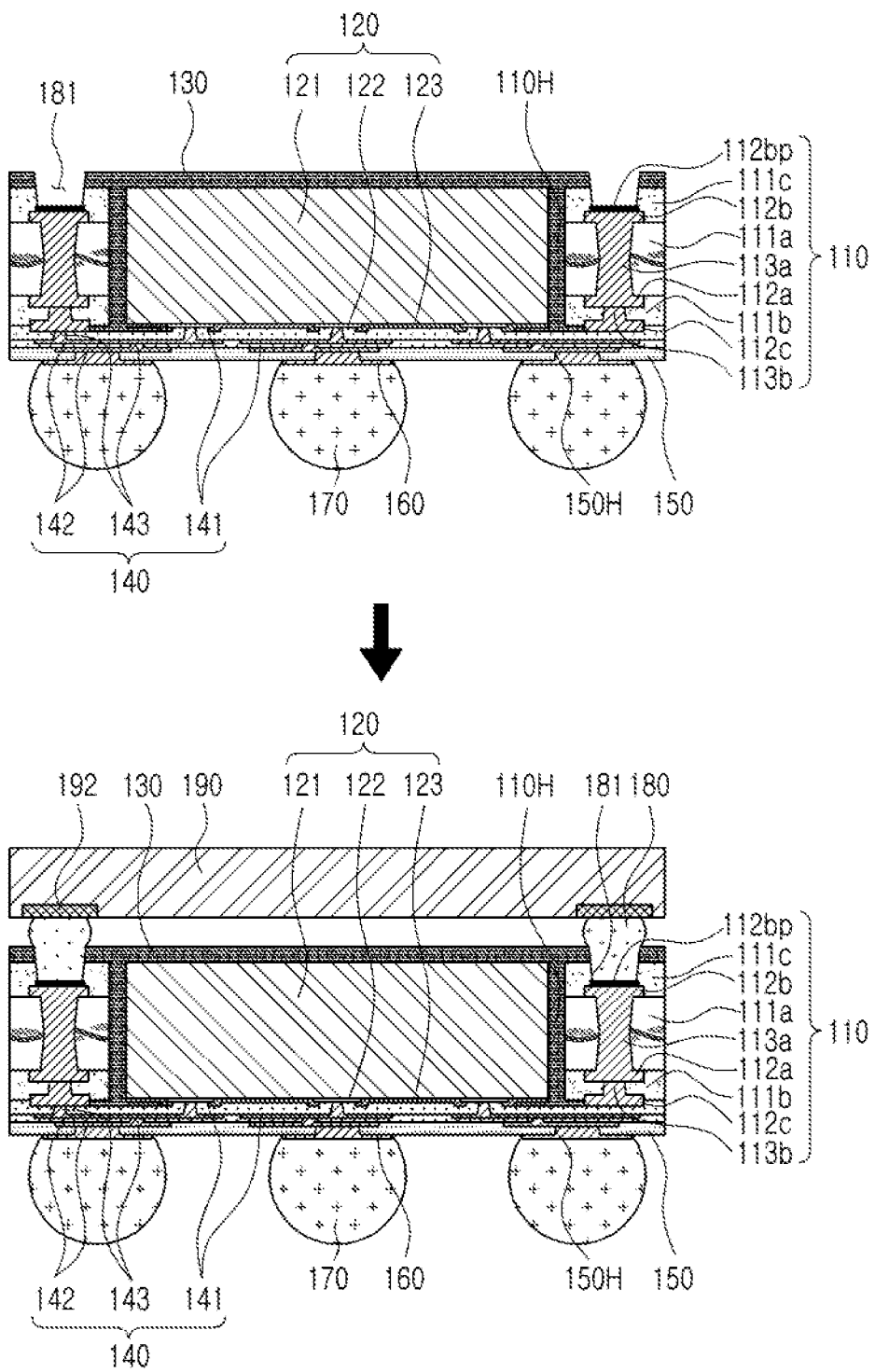

FIGS. 14A through 14C are schematic views illustrating an example of processes of manufacturing the fan-out semiconductor package of FIG. 12.

Referring to FIG. 14A, the first insulating layer 111a may be first prepared. The first insulating layer 111a may be a copper clad laminate (CCL), an unclad CCL, or the like. Although not illustrated in the drawings, copper foils may be formed on upper and lower surfaces of the first insulating layer 111a. Then, via holes penetrating through the first insulating layer 111a may be formed using laser drilling and/or mechanical drilling, and the first and second redistribution layers 112a and 112b and the first vias 113a may be formed using the copper foils formed on the upper and lower surfaces of the first insulating layer 111a by a plating process using resist patterns. The surface treatment layer 112bp may be formed on the surface of the second redistribution layer 112b. Then, the second and third insulating layers 111b and 111c may be formed on the upper and lower surfaces of the first insulating layer 111a, respectively, and the third redistribution layer 112c and the second vias 113b may be formed on and in the second insulating layer 111b by a via hole machining process, a plating process, and the like.

Then, referring to FIG. 14B, the first connection member 110 obtained by forming the through-hole 110H may be attached to a tape 230. Then, the semiconductor chip 120 may be attached to the tape 230 in the through-hole 110H, and may be encapsulated with the encapsulant 130. Then, a detachable film 250 may be attached to the encapsulant 130. The detachable film 250 may be a substrate formed of various materials, such as a copper clad laminate (CCL), a ceramic substrate, a glass substrate, or the like. Then, the tape 230 may be removed, and the second connection member 140, the passivation layer 150, and the underbump metal layer 160 may be sequentially formed in a region in which the tape 230 is removed. The second connection member 140 may be formed by forming the insulating layers 141 using a PID, or the like, and drilling via holes by a photolithography method, and then performing patterning by a plating process to form the redistribution layers 142 and the vias 143. The passivation layer 150 may be formed by the known lamination method or applying and hardening method. The underbump metal layer 160 may be formed by the known metallization process.

Then, referring to FIG. 14C, the detachable film 250 may be removed, and the openings 181 penetrating through the encapsulant 130 and a portion of the first connection member 110 may be formed. The openings 181 may be formed using laser drilling, mechanical drilling, or the like. In addition, the electrical connection structures 170 may be formed. The electrical connection structures 170 may also be formed by performing a reflow process, or the like, on solders, or the like. Then, the electrical connection structures 180 may be formed in the openings 181 using solders, or the like, and the circuit board 190 may be connected to the electrical connection structures 180. The fan-out semiconductor package 100A according to the exemplary embodiment described above may be manufactured through a series of processes.

A description, or the like, of other configurations except for the abovementioned configuration overlaps that described above, and is thus omitted.

As set forth above, according to the exemplary embodiments in the present disclosure, a fan-out semiconductor package in which a cost may be reduced, a thickness may be reduced due to a reduction in a joint gap, and a warpage control effect may be achieved may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a semiconductor chip having an active surface having connection pads disposed thereon and an inactive surface opposing the active surface;
   a first connection member having a through-hole in which the semiconductor chip is disposed and including a plurality of redistribution layers electrically connected to the connection pads and one or more layers of vias electrically connecting the plurality of redistribution layers to each other;
   an encapsulant covering an upper surface of the first connection member, encapsulating at least portions of side surfaces and the inactive surface of the semiconductor chip, and extending continuously from the upper surface of the first connection member and the inactive surface into the through-hole; and
   a second connection member disposed on a lower surface of the first connection member opposing the upper surface, disposed on the active surface of the semiconductor chip, and including a redistribution layer electrically connected to the connection pads,
   wherein a portion of the encapsulant covering the upper surface of the first connection member has a first opening exposing a portion of the first connection member,
   the first connection member has a second opening exposing a portion of a redistribution layer disposed at an uppermost portion among the plurality of redistribution layers,
   at least portions of the first opening and the second opening overlap each other, and
   the uppermost portion among the plurality of redistribution layers is spaced apart from the encapsulant.

2. The fan-out semiconductor package of claim 1, further comprising an electrical connection structure filling the first and second openings and protruding from the encapsulant,
   wherein the electrical connection structure is connected to the redistribution layer disposed in the uppermost position.

3. The fan-out semiconductor package of claim 2, wherein the electrical connection structure includes a solder ball, and the plurality of redistribution layers and the one or more layers of vias are made of a material different from the solder ball.

4. The fan-out semiconductor package of claim 2, further comprising a surface treatment layer disposed between the electrical connection structure and the uppermost portion of the plurality of redistribution layers.

5. The fan-out semiconductor package of claim 2, further comprising a circuit board disposed above the encapsulant to be spaced apart from the encapsulant and connected to the electrical connection structure.

6. The fan-out semiconductor package of claim 1, wherein the first connection member includes a first insulating layer in contact with the second connection member, a first redistribution layer in contact with the second connection member and embedded in a first surface of the first insulating layer, a second redistribution layer disposed on a second surface of the first insulating layer opposing the first surface of the first insulating layer, vias penetrating through the first insulating layer and connecting the first and second redistribution layers to each other, and a second insulating layer disposed on the first insulating layer and covering at least portions of the second redistribution layer,
the second opening penetrates through the second insulating layer to expose a portion of the second redistribution layer, and
the first and second redistribution layers are electrically connected to the connection pads.

7. The fan-out semiconductor package of claim 6, further comprising an electrical connection structure filling the first and second openings and protruding from the encapsulant, wherein the electrical connection structure is connected to the second redistribution layer.

8. The fan-out semiconductor package of claim 7, further comprising a surface treatment layer disposed between the electrical connection structure and the second redistribution layer.

9. The fan-out semiconductor package of claim 6, wherein a distance between the redistribution layer of the second connection member and the first redistribution layer is greater than that between the redistribution layer of the second connection member and the connection pad.

10. The fan-out semiconductor package of claim 6, wherein the first and second redistribution layers have a thickness greater than that of the redistribution layer of the second connection member.

11. The fan-out semiconductor package of claim 1, wherein the first connection member includes a first insulating layer, a first redistribution layer disposed on a lower surface of the first insulating layer, a second redistribution layer disposed on an upper surface of the first insulating layer, first vias penetrating through the first insulating layer and electrically connecting the first and second redistribution layers to each other, a second insulating layer disposed on the lower surface of the first insulating layer and covering at least portions of the first redistribution layer, a third redistribution layer disposed on a lower surface of the second insulating layer and in contact with the second connection member, second vias penetrating through the second insulating layer and connecting the first and third redistribution layers to each other, and a third insulating layer disposed on the upper surface of the first insulating layer and covering at least portions of the second redistribution layer,
the second opening penetrates through the third insulating layer to expose a portion of the second redistribution layer, and
the first to third redistribution layers are electrically connected to the connection pads.

12. The fan-out semiconductor package of claim 11, further comprising an electrical connection structure filling the first and second openings and protruding from the encapsulant,
wherein the electrical connection structure is connected to the second redistribution layer.

13. The fan-out semiconductor package of claim 12, further comprising a surface treatment layer disposed between the electrical connection structures and the second redistribution layer.

14. The fan-out semiconductor package of claim 11, wherein the first insulating layer has a thickness greater than that of the second insulating layer.

15. The fan-out semiconductor package of claim 11, wherein the first to third redistribution layers have a thickness greater than that of the redistribution layer of the second connection member.

16. The fan-out semiconductor package of claim 1, wherein a content of a metal constituting the plurality of redistribution layers and the one or more layers of vias is higher in a lower portion of the first connection member than in an upper portion of the first connection member.

17. A fan-out semiconductor package comprising:
a semiconductor chip having an active surface having connection pads disposed thereon and an inactive surface opposing the active surface;
a first connection member having a through-hole in which the semiconductor chip is disposed and including a plurality of redistribution layers electrically connected to the connection pads and one or more layers of vias electrically connecting the plurality of redistribution layers to each other;
an encapsulant covering an upper surface of the first connection member, encapsulating at least portions of side surfaces and the inactive surface of the semiconductor chip, and extending continuously from the upper surface of the first connection member and the inactive surface into the through-hole;
an electrical connection structure; and
a second connection member disposed on a lower surface of the first connection member opposing the upper surface, disposed on the active surface of the semiconductor chip, and including a redistribution layer electrically connected to the connection pads,
wherein a portion of the encapsulant covering the upper surface of the first connection member has a first opening exposing a portion of the first connection member,
the first connection member has a second opening exposing a portion of a redistribution layer disposed at an uppermost portion among the plurality of redistribution layers,
the electrical connection structure fills the first and second openings and protrudes from the encapsulant,
the electrical connection structure is connected to the redistribution layer disposed at the uppermost position, and
the redistribution layer disposed at the uppermost position is spaced apart from the encapsulant.

18. The fan-out semiconductor package of claim 17, wherein the electrical connection structure includes a solder ball, and the plurality of redistribution layers and the one or more layers of vias are made of a material different from the solder ball.

19. The fan-out semiconductor package of claim 17, further comprising a surface treatment layer disposed between the electrical connection structure and the redistribution layer disposed in the uppermost position.

\* \* \* \* \*